(12) United States Patent
Lee et al.

(10) Patent No.: US 9,690,204 B2
(45) Date of Patent: Jun. 27, 2017

(54) MASKLESS EXPOSURE DEVICE, MASKLESS EXPOSURE METHOD AND DISPLAY SUBSTRATE MANUFACTURED BY THE MASKLESS EXPOSURE DEVICE AND THE MASKLESS EXPOSURE METHOD

(71) Applicant: SAMSUNG DISPLAY CO., LTD., Yongin, Gyeonggi-Do (KR)

(72) Inventors: Sang-Hyun Lee, Suwon-si (KR); Hyun-Seok Kim, Hwaseong-si (KR); Jung-Chul Heo, Seoul (KR); Hi-Kuk Lee, Yongin-si (KR); Sang-Hyun Yun, Suwon-si (KR); Ki-Beom Lee, Seoul (KR); Chang-Hoon Kim, Asan-si (KR); Jung-In Park, Seoul (KR); Kab-Jong Seo, Seoul (KR); Jun-Ho Sim, Suwon-si (KR); Jae-Hyuk Chang, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 19 days.

(21) Appl. No.: 14/664,770

(22) Filed: Mar. 20, 2015

(65) Prior Publication Data
US 2016/0054660 A1    Feb. 25, 2016

(30) Foreign Application Priority Data
Aug. 25, 2014   (KR) ........................ 10-2014-0110922

(51) Int. Cl.
G03B 27/44    (2006.01)
G03B 27/68    (2006.01)
(Continued)

(52) U.S. Cl.
CPC ...... *G03F 7/70291* (2013.01); *G03F 7/70508* (2013.01); *H01L 27/124* (2013.01);
(Continued)

(58) Field of Classification Search
CPC .. G03F 7/702; G03F 7/70283; G03F 7/70291; G03F 7/70383; G03F 7/70375;
(Continued)

(56) References Cited

U.S. PATENT DOCUMENTS

| 5,691,541 A | * | 11/1997 | Ceglio | ................ G03F 7/70041 250/492.1 |
| 6,717,650 B2 | * | 4/2004 | Jain | ..................... G03F 7/70466 355/53 |
| 8,574,971 B2 | | 11/2013 | Yun et al. | |
| 2005/0161742 A1 | * | 7/2005 | Isobe | .................. H01L 21/2022 257/347 |

(Continued)

FOREIGN PATENT DOCUMENTS

| KR | 10-2008-0032290 A | 4/2008 |
| KR | 10-2011-0106081 A | 9/2011 |
| KR | 10-2012-0078014 A | 7/2012 |

*Primary Examiner* — Christina Riddle
(74) *Attorney, Agent, or Firm* — Lewis Roca Rothgerber Christie LLP

(57) ABSTRACT

A maskless exposure device includes an exposure head including a digital micro-mirror device, the digital micro-mirror device being configured to scan an exposure beam to a substrate by reflecting a source beam from an exposure source; and a system control part configured to control the digital micro-mirror device by utilizing a graphic data system file. The graphic data system file includes data for a source electrode, a drain electrode and a channel portion between the source electrode and the drain electrode in a plan view. The channel portion includes a first portion extending in a direction perpendicular to a scan direction of the exposure head. A width of the first portion of the channel portion is defined to be a multiple of a pulse event generation of the exposure beam.

20 Claims, 10 Drawing Sheets

(51) Int. Cl.
  *G03F 7/20* (2006.01)
  *H01L 29/786* (2006.01)
  *H01L 27/12* (2006.01)
  *H01L 29/417* (2006.01)

(52) U.S. Cl.
  CPC .... *H01L 27/1285* (2013.01); *H01L 29/41733* (2013.01); *H01L 29/78696* (2013.01)

(58) Field of Classification Search
  CPC ............. G03F 7/70391; G03F 7/70425; G03F 7/70433; G03F 7/70508; G03F 7/70525; G03F 7/70491; H01L 27/1285; H01L 29/78696; H01L 27/124; H01L 27/84
  USPC ......... 355/46, 52, 53, 55, 67–71, 72–75, 77; 250/492.1, 492.2, 492.22, 492.23, 493.1, 250/494.1, 503.1, 504 R, 548
  See application file for complete search history.

(56) References Cited

U.S. PATENT DOCUMENTS

| | | | |
|---|---|---|---|
| 2005/0206866 A1* | 9/2005 | Ozaki | G03F 7/70283 355/53 |
| 2009/0098479 A1* | 4/2009 | Sykes | G03F 7/70041 430/270.1 |
| 2010/0081072 A1* | 4/2010 | Iosad | G03F 7/70508 430/30 |
| 2010/0099049 A1* | 4/2010 | Owa | G03F 7/70291 430/322 |
| 2011/0205508 A1* | 8/2011 | Yun | G03B 27/52 355/41 |
| 2012/0241740 A1* | 9/2012 | Park | H01L 27/1288 257/49 |
| 2015/0049316 A1* | 2/2015 | Kim | G03F 7/70291 355/67 |

* cited by examiner

MASKLESS EXPOSURE DEVICE, MASKLESS EXPOSURE METHOD AND DISPLAY SUBSTRATE MANUFACTURED BY THE MASKLESS EXPOSURE DEVICE AND THE MASKLESS EXPOSURE METHOD

CROSS-REFERENCE TO RELATED APPLICATION

This application claims priority to and the benefit of Korean Patent Application No. 10-2014-0110922, filed on Aug. 25, 2014 in the Korean Intellectual Property Office (KIPO), the entire content of which is incorporated herein by reference.

BACKGROUND

1. Field

Exemplary embodiments of the present inventive concept relate to a maskless exposure device, a maskless exposure method and a display substrate manufactured by the maskless exposure device and/or the maskless exposure method.

2. Description of the Related Art

Generally, to form a metal pattern including a thin film transistor ("TFT"), which is a switching element of a display substrate and signal lines, a metal layer and a photoresist layer are sequentially formed, and a mask corresponding to the metal pattern is disposed on the photoresist layer.

Then, a light is irradiated to an upper surface of the mask so that the photoresist layer is exposed and developed. Thus, a photoresist pattern corresponding to the mask is formed. The metal layer is etched to form a metal pattern. When the metal layer is etched, the photoresist pattern functions as an etch stopping layer.

A display substrate having a plurality of metal patterns having different shapes or patterns from each other is formed using a plurality of masks such that a number of the plurality of masks corresponds to a number of the metal patterns. In addition, when a shape of the metal pattern is to be changed, the shape of the mask is changed correspondingly and a new mask is fabricated. A fabricating cost of the mask is relatively high, and therefore, a manufacturing cost of the display substrate may increase.

In response to the above mentioned problems, a maskless exposure device providing a plurality of beams to a substrate without a mask has been used. In the maskless exposure device, the beams are independently turned on or off so that the beams are selectively provided to the substrate. Thus, a desired photoresist pattern may be formed on the substrate.

However, each beam has a different optical character, such as a size of the beam, a position of the beam and/or an intensity of the beam. Thus, a wiring (e.g., the metal pattern) may be formed to have a non-uniform shape. Accordingly, defects, such as staining of a display panel including the wiring may occur.

SUMMARY

Aspects of exemplary embodiments of the present inventive concept are directed toward a maskless exposure device capable of decreasing a likelihood or amount of defects on a display panel.

Aspects of exemplary embodiments of the present inventive concept are directed toward a maskless exposure method capable of decreasing a likelihood or amount of defects on a display panel.

Aspects of exemplary embodiments of the present inventive concept are directed toward a display substrate manufactured by the maskless exposure device and/or the maskless exposure method.

An exemplary embodiment of a maskless exposure device includes an exposure head including a digital micro-mirror device, the digital micro-mirror device being configured to scan an exposure beam to a substrate by reflecting a source beam from an exposure source; and a system control part configured to control the digital micro-mirror device by utilizing a graphic data system file. The graphic data system file includes data for a source electrode, a drain electrode, and a channel portion between the source electrode and the drain electrode in a plan view. The channel portion includes a first portion extending in a direction crossing a scan direction of the exposure head. A first width of the first portion of the channel portion is defined to be a multiple of a pulse event generation of the exposure beam.

In an exemplary embodiment, the channel portion may have a U shape in a plan view.

In an exemplary embodiment, the channel portion may further include a second portion extending in a direction parallel with a scan direction of the exposure head. The second portion may have a second width different from the first width.

In an exemplary embodiment, the first width may be greater than the second width.

In an exemplary embodiment, the pulse event generation of the exposure beam may be about 1.25 μm.

In an exemplary embodiment, the channel portion may have an I shape in a plan view.

In an exemplary embodiment, the pulse event generation of the exposure beam may be about 1.25 μm.

In an exemplary embodiment, the system control part may include a file producing part configured to produce the graphic data system file respectively corresponding to each of a plurality of patterns to be formed on the substrate, a data outputting part configured to generate digital micro-mirror device on/off data from the graphic data system file to control on/off timing of the digital micro-mirror device and a transfer control part configured to output a transfer signal to move a stage relative to the digital micro-mirror device, the substrate being on the stage.

In an exemplary embodiment, the transfer control part may be configured to control on/off timing of the exposure beam according to the digital micro-mirror device on/off data supplied from the data outputting part and to transfer the stage.

An exemplary embodiment of a method of maskless exposure includes producing a graphic data system file corresponding to a pattern to be formed on a substrate, generating digital micro-mirror device on/off data from the graphic data system file and exposing the substrate according to the digital micro-mirror device on/off data. The graphic data system file includes data for a source electrode, a drain electrode and a channel portion between the source electrode and the drain electrode in a plan view. The channel portion includes a first portion extending in a direction crossing a scan direction of an exposure head. A first width of the first portion of the channel portion is defined to be a multiple of a pulse event generation of an exposure beam.

In an exemplary embodiment, the channel portion may have a U shape in a plan view.

In an exemplary embodiment, the channel portion may further include a second portion extending in a direction parallel with a scan direction of the exposure head. The second portion may have a second width different from the first width.

In an exemplary embodiment, the first width may be greater than the second width.

In an exemplary embodiment, the pulse event generation of the exposure beam may be about 1.25 μm.

In an exemplary embodiment, the channel portion may have an I shape in a plan view.

In an exemplary embodiment, the pulse event generation of the exposure beam may be about 1.25 μm.

An exemplary embodiment of a display substrate includes a gate line extending in a first direction, a data line extending in a second direction crossing the first direction and a switching element including a gate electrode electrically coupled to the gate line, a source electrode electrically coupled to the data line, and a drain electrode spaced apart from the source electrode. The source electrode is spaced apart from the drain electrode by a first distance in the first direction. The source electrode is spaced apart from the drain electrode in the second direction by a second distance different from the first distance.

In an exemplary embodiment, the first distance may be greater than the second distance.

In an exemplary embodiment, the display substrate may further include a channel portion, and the channel portion may have a U shape in a plan view.

In an exemplary embodiment, the display substrate may further include a channel portion, and the channel portion may have an I shape in a plan view.

According to an exemplary embodiment, a source electrode pattern is spaced apart from a drain electrode pattern by a first width in a direction parallel or substantially parallel to the scan direction of the exposure head. The first width may be defined to be a multiple of a pulse event generation of the exposure beam. Thus, a pattern extended in a direction perpendicular or substantially perpendicular to the scan direction SD of the exposure head may be formed uniformly such that defects on the pattern due to a mismatch between the pulse event generation (PEG) and the designed width of the pattern may be decreased.

BRIEF DESCRIPTION OF THE DRAWINGS

The above and other features and advantages of the present inventive concept will become more apparent from the following detailed description when considered together with the accompanying drawings, in which.

DETAILED DESCRIPTION

Figure 1:
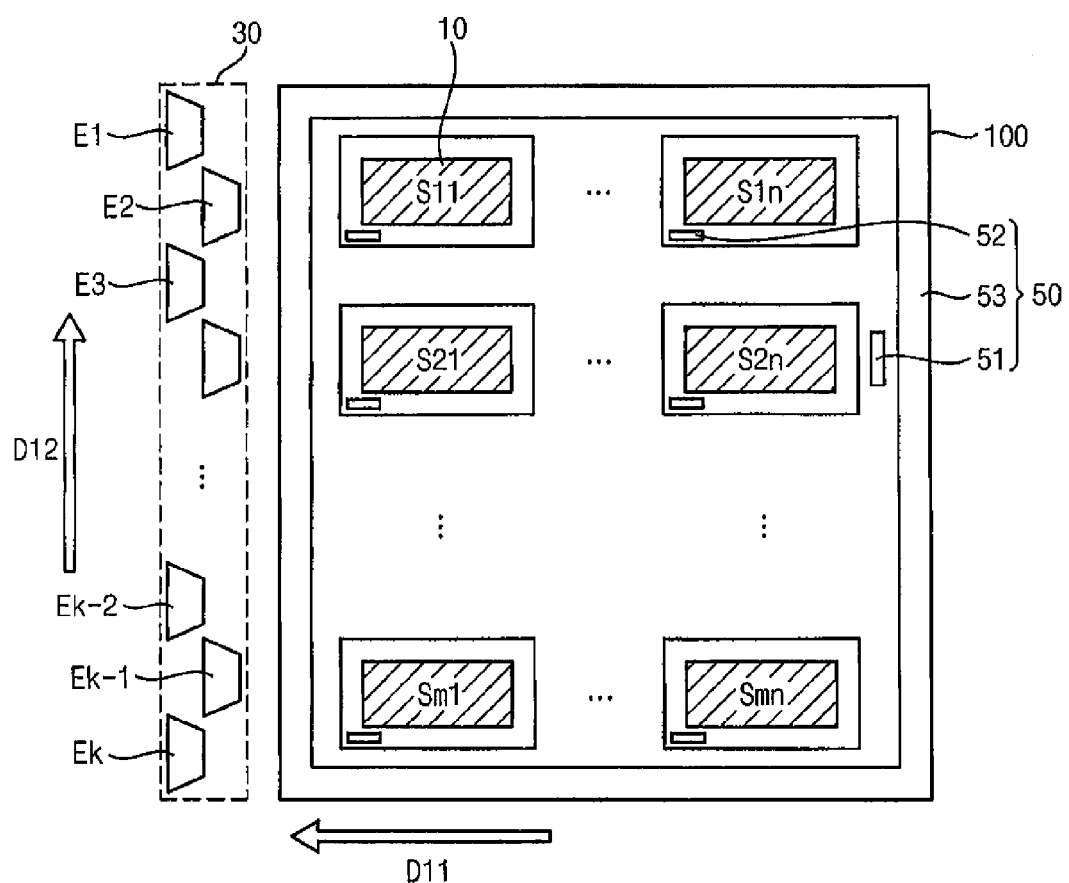
FIG. 1 is a plan view illustrating a maskless exposure device according to an exemplary embodiment of the present inventive concept.

Hereinafter, the present invention will be explained in detail with reference to the accompanying drawings. In the following detailed description, only certain embodiments of the present invention are shown and described, by way of illustration. As those skilled in the art would recognize, the invention may be embodied in many different forms and should not be construed as being limited to the embodiments set forth herein. Also, in the context of the present application, when a first element is referred to as being "on" a second element, it can be directly on the second element or be indirectly on the second element with one or more intervening elements interposed therebetween. Further, in the context of the present application, when, a first element is referred to as being "coupled or connected to" a second element, it can be directly coupled or connected to the second element or be indirectly coupled or connected to the second element with one or more intervening elements interposed therebetween. Like reference numerals designate like elements throughout the specification.

FIG. 1 is a plan view illustrating a maskless exposure device according to an exemplary embodiment of the present inventive concept.

Referring to FIG. 1, a substrate 100 is a main substrate for forming a display panel. The substrate 100 includes a plurality of first areas 10 and a plurality of second areas 50 excluding (or outside of) the first areas 10. A plurality of display panels S11, . . . , S1n, S21, . . . , S2n, . . . , Sm1, . . . , Smn are arranged in a matrix shape with one display panel formed in each first area 10. In this case, 'm' and 'n' are natural numbers. The second areas 50 include a glass ID area 51, where an identification number of the substrate 100 is formed or located, and cell ID areas 52, where identification numbers of the display panels are respectively formed or located. In addition, the second areas 50 include an edge exposure area 53 that is an edge portion of the substrate 100.

The substrate 100 is transferred below an exposure part 30 along a first direction D11 to be exposed. For example, the substrate 100 is moved relative to the exposure part 30 along the first direction D11. The substrate 100 is transferred to the exposure part 30 by a stage disposed below the substrate 100.

To expose the substrate 100, a step exposing method or a scan exposing method may be employed. In a step exposing method, the substrate is transferred (e.g., moved relative to the exposure part) and stopped repeatedly during exposure. In a scan exposing method, the substrate is continuously transferred (e.g., continuously moved relative to the exposure part) during exposure. For example, an island pattern may be formed through a step exposing method, and a strip pattern may be formed through a scan exposing method.

The exposure part 30 includes a plurality of exposure heads E1, E2, E3, . . . , Ek-2, Ek-1 and Ek. The exposure heads E1, E2, E3, . . . , Ek-2, Ek-1 and Ek are arranged in a second direction D12 perpendicular or substantially perpendicular to the first direction D11. In this case, 'k' is a natural number.

For example, the exposure heads E1, E2, E3, . . . , Ek-2, Ek-1 and Ek are disposed in two rows. The exposure heads of a first row and the exposure heads of a second row may be alternately disposed in the second direction D12. The exposure heads E1, E2, E3, . . . , Ek-2, Ek-1 and Ek, however, are not limited thereto and may have various suitable arrangements in the second direction D12.

The exposure part 30 exposes the substrate 100 being transferred (e.g., moved relative to the exposure part 30) in the first direction D11, so that an exposure pattern is formed in a direction reverse to that of the first direction D11.

The exposure heads E1, E2, E3, . . . , Ek-2, Ek-1 and Ek each include a digital micro-mirror device ("DMD"). The DMD may irradiate an exposure beam in response to or according to an on/off data signal. A source beam from a digital mirror of a cell of the DMD is reflected to generate the exposure beam, and the exposure beam may exit from one of the exposure heads E1, E2, E3, . . . , Ek-2, Ek-1 and Ek.

Figure 2:
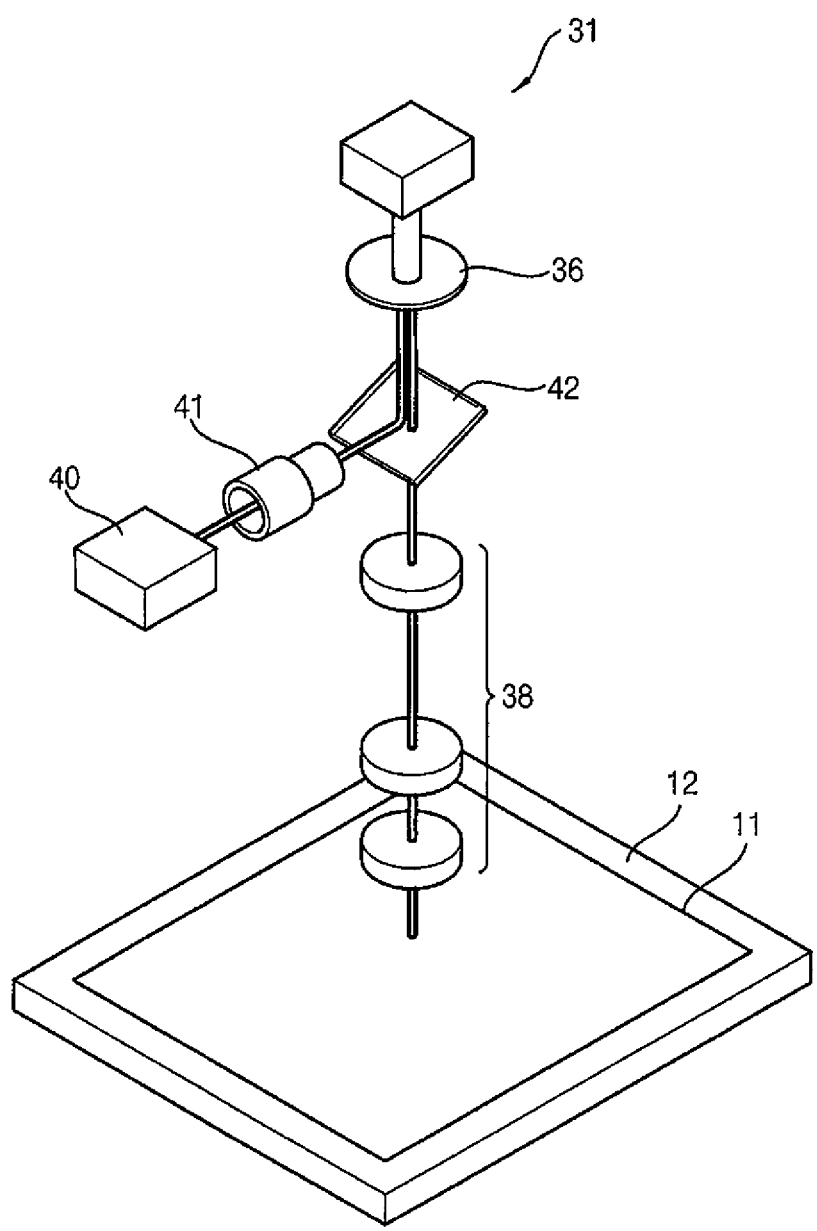
FIG. 2 is a perspective view illustrating an exposure head according to an exemplary embodiment of the exposure device of FIG. 1.

FIG. 2 is a perspective view illustrating an exposure head according to an exemplary embodiment of the exposure device of FIG. 1.

Referring to FIGS. 1 and 2, an exposure head 31 includes a DMD 36. The DMD 36 receives a source beam from an exposure source 40 through a beam shaping element 41. The source beam may be an ultraviolet (UV) ray for exposing a photoresist film 11. The photoresist film 11 is on or formed on a target substrate 12 corresponding to an object to be exposed. When a pattern is to be formed on a substrate, the photoresist film 11 is used to form a mask of the pattern. The photoresist film 11 may be formed by coating a photosensitive resin such as an epoxy resin on a surface of, for example, a glass substrate. The DMD 36 includes a mirror 42 that selectively reflects the source beam for each pixel based on image data transferred or mapped onto the target substrate 12.

The exposure head 31 includes a projection optical device 38. The projection optical device 38 includes a plurality of lenses, and converts light selectively reflected from the DMD 36 into the exposure beam.

Figure 3:
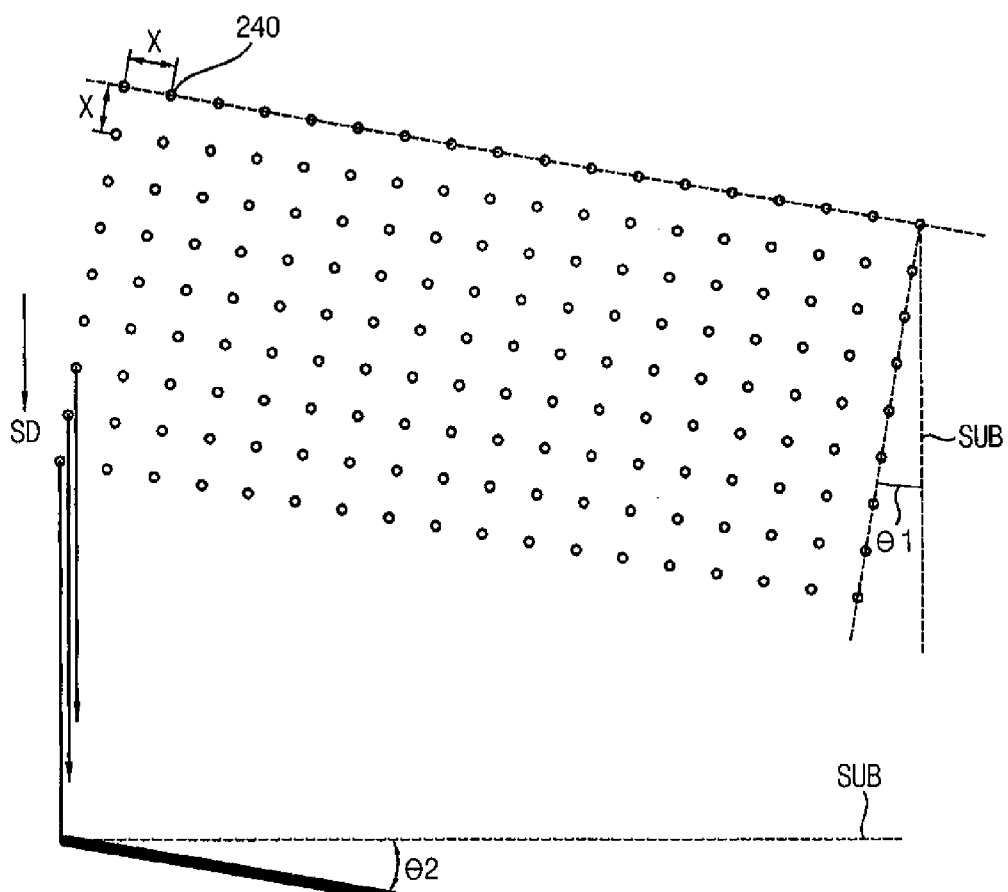
FIG. 3 is a plan view illustrating an embodiment of an exposure step using the exposure head of FIG. 1.
Figure 3:
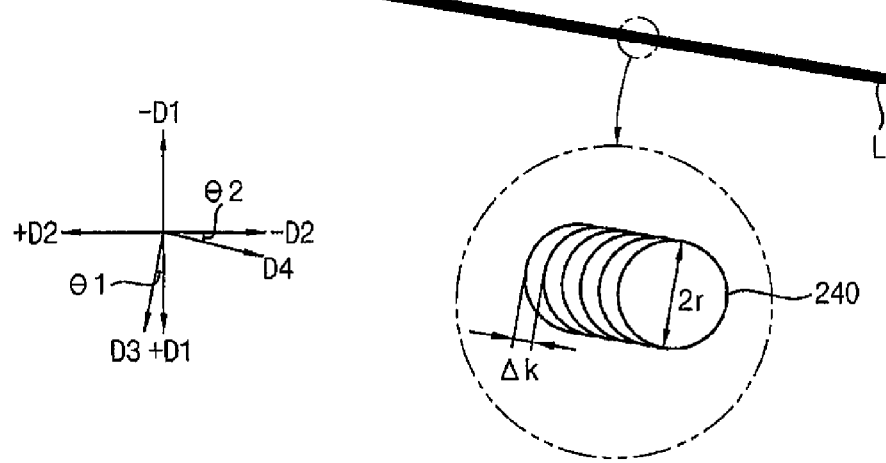

FIG. 3 is a plan view illustrating an exposure step using an exposure head in FIG. 1.

Referring to FIG. 3, a maskless exposure device according to an exemplary embodiment of the present inventive concept is fixed or oriented to be inclined by a first angle $\theta_1$ with respect to a side of the substrate SUB extending in a first direction +D1 and −D1. When a second direction +D2 and −D2 defines a direction perpendicular or substantially perpendicular to the first direction +D1 and −D1, an inclined direction of the maskless exposure device is between the first direction +D1 and −D1 and the second direction +D2 and −D2. Hereinafter, the first direction +D1 and −D1 is divided into a positive first direction +D1 and a negative first direction −D1, and the second direction +D2 and −D2 is divided into a positive second direction +D2 and a negative second direction −D2.

The inclined direction of the maskless exposure device may be a third direction D3 between the positive first direction +D1 and the positive second direction +D2. The first angle $\theta_1$ is defined as an acute angle rotated in a clockwise direction with respect to a reference line extending in the first direction +D1 and −D1. For example, the first angle $\theta_1$ may be between about 0.1° and about 0.5° (relative to the positive first direction +D1).

The maskless exposure device inclined with respect to the third direction D3 provides the spot beams 240 onto the substrate SUB along a scanning direction SD. The scanning direction SD is substantially the same as the first positive direction +D1 (e.g., the scanning direction SD is parallel or substantially parallel with the first positive direction +D1). When the first angle $\theta_1$ of the maskless exposure device is about 0° and the maskless exposure device exposes the substrate SUB along the positive first direction +D1, a region between the spot beams 240 adjacent to each other of the substrate SUB is not exposed. Therefore, in order to entirely or substantially entirely expose a set or predetermined region, the maskless exposure device inclined with respect to the substrate SUB by the first angle $\theta_1$ provides the light onto the substrate SUB.

When micro-mirrors receive the activated data and the spot beams 240 are irradiated onto the substrate SUB which is stopped, the spot beams 240 are spaced apart from each other in the third direction D3 by a set or predetermined distance "x." In addition, the spot beams 240 are spaced apart from each other in a direction perpendicular or substantially perpendicular to the third direction D3 by the same set or predetermined distance "x."

In order to selectively expose a set or predetermined region of the substrate SUB, for example, a pattern-formed region L, the spot beams 240 are selectively irradiated in the pattern-formed region L. In the present example embodiment, the pattern-formed region L is defined as a region extending along a fourth direction D4 inclined in a clockwise direction with respect to a side of the substrate SUB by a second angle $\theta_2$. The pattern-formed region L is designed by an operator to have a rectangular shape extending in the fourth direction D4. When the maskless exposure device entirely or substantially entirely exposes the pattern-formed region L, the spot beams 240 of a circular shape having a diameter "2r" overlap with each other by a set or predetermined distance "Δk" in the pattern-formed region L so that the substrate SUB of the pattern-formed region L is entirely or substantially entirely exposed.

Figure 4:
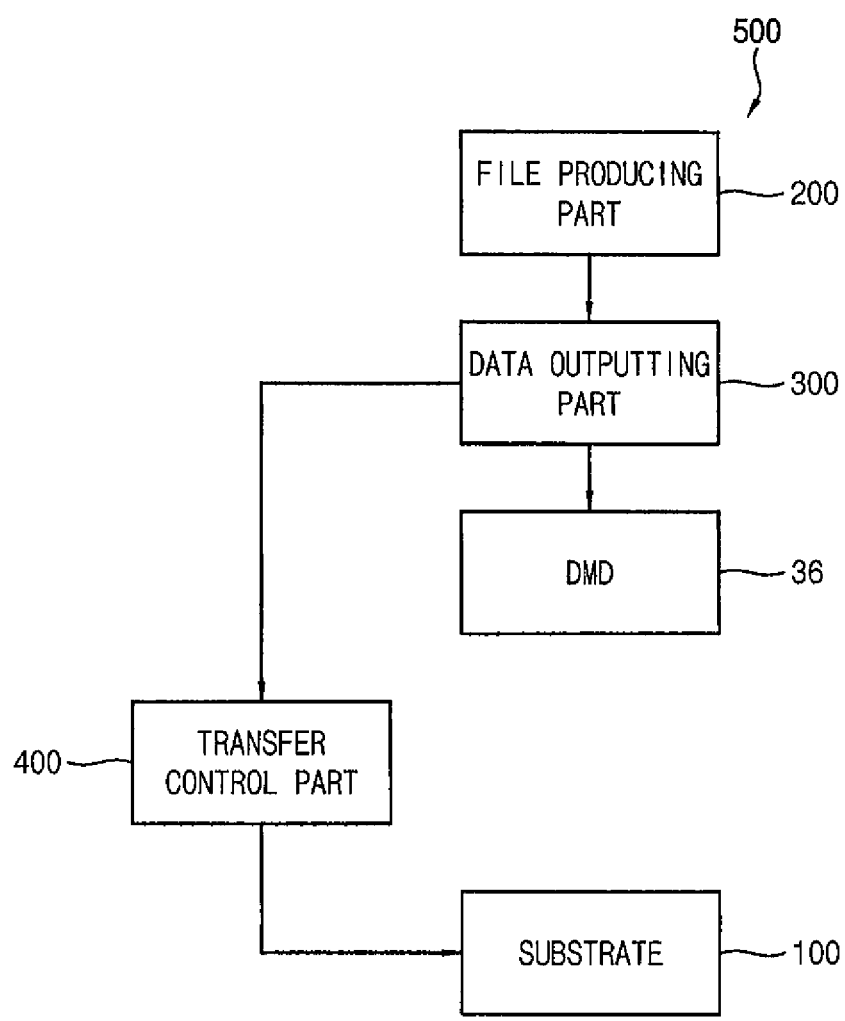
FIG. 4 is a block diagram of a system control part according to an exemplary embodiment of the maskless exposure device of FIG. 1.

FIG. 4 is a block diagram of a system control part according to an exemplary embodiment of the maskless exposure device of FIG. 1.

Referring to FIGS. 1 and 4, the system control part 500 may include a file producing part 200, a data outputting part 300 and a transfer control part 400.

The file producing part 200 produces a graphic data system ("GDS") file. The GDS file is an inverse of a multilayered computer-aided design (CAD) file. For example, the GDS file includes data for each layer such as a gate pattern, an active pattern, source drain patterns, and the like.

The data outputting part 300 generates the digital micro-mirror device on/off data from the graphic data system GDS file.

The data outputting part 300 outputs the digital micro-mirror device on/off data to the digital micro-mirror device (DMD) 36.

The transfer control part 400 outputs a transfer signal which transfers the stage (e.g., moves the stage relative to the DMD 36). The transfer control part 400 controls on/off timing of the exposure beam in response to or according to the DMD on/off data supplied from the data outputting part 300, and transfers the stage (e.g., moves the stage relative to the DMD 36).

The maskless exposure device according to an exemplary embodiment of the present inventive concept may manufacture a display substrate by using a manufacturing method including producing a graphic data system file respectively corresponding to each of a plurality of patterns to be formed on the substrate 100, generating digital micro-mirror device (DMD) on/off data from the graphic data system file to control on/off timing of the digital micro-mirror device (DMD) and exposing the substrate 100 according to the digital micro-mirror device (DMD) on/off data.

The DMD on/off data is generated from the GDS file in the data outputting part 300. An on/off file for generating the DMD on/off data may be configured or represented by '1's and '0's in a binary file. In this embodiment, when the on/off data is '1', the DMD is turned on so that light is delivered to the substrate. Alternatively, when the on/off data is '0', the DMD is turned off so that the light is not delivered to the substrate.

The DMD selectively reflects the light based on the DMD on/off data to expose the substrate 100 according to the data of the patterns stored in the GDS file. Therefore, a substrate having selected patterns may be formed.

Figure 5:
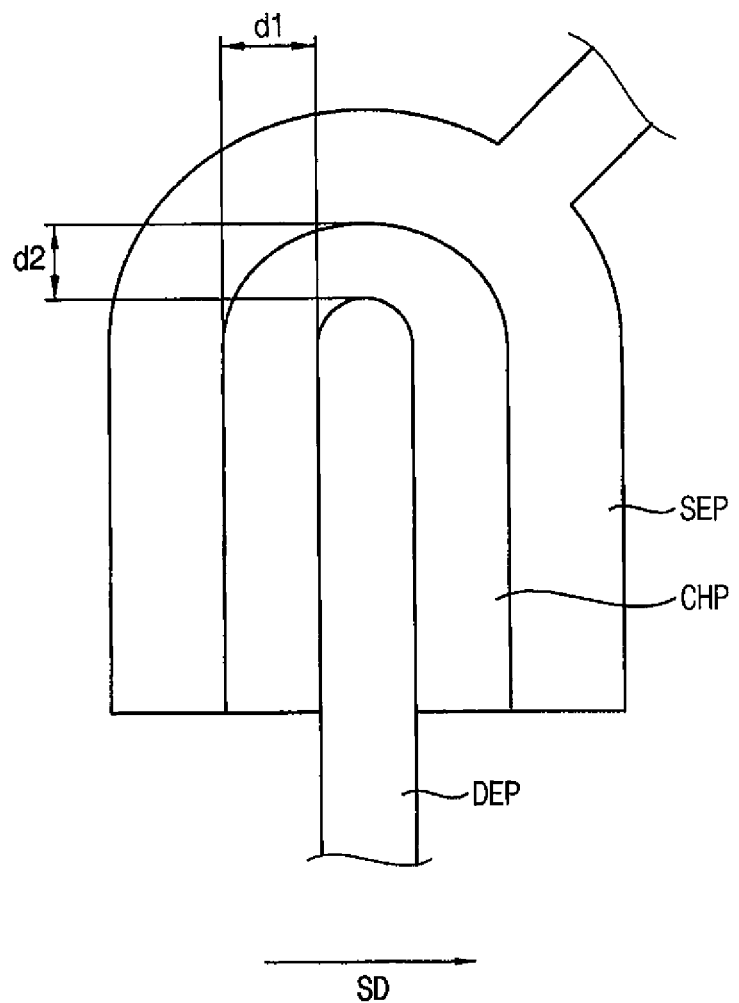
FIG. 5 is a plan view illustrating a source electrode, a drain electrode and a channel portion of a graphic data system file used for a digital micro-mirror device of an exposure head according to an exemplary embodiment of the present inventive concept.
Figure 6:
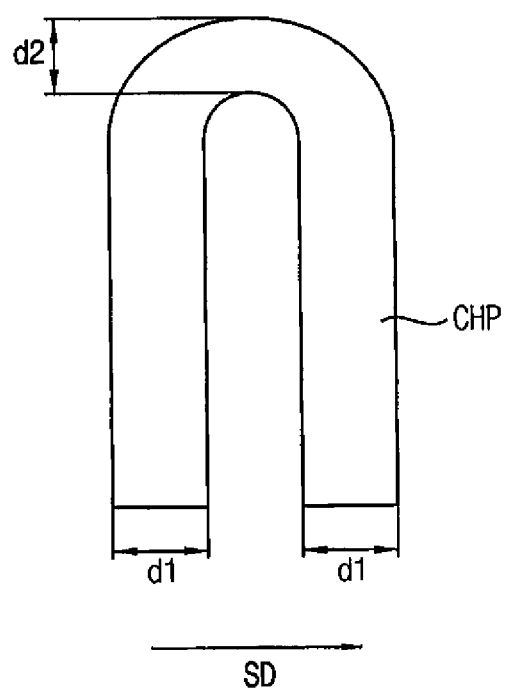
FIG. 6 is a plan view illustrating the channel portion of FIG. 5.

FIG. 5 is a plan view illustrating a source electrode, a drain electrode and a channel portion of a graphic data system file used for a digital micro-mirror device of an exposure head according to an exemplary embodiment of the present inventive concept. FIG. 6 is a plan view illustrating the channel portion of FIG. 5.

Referring to FIGS. 5 and 6, a source electrode pattern SEP, a drain electrode pattern DEP and a channel portion pattern CHP of a graphic data system file used for a digital micro-mirror device of an exposure head are illustrated.

The source electrode pattern SEP may have a "U" shape in a plan view. The drain electrode pattern DEP may be disposed between the source electrode pattern SEP in a plan view (e.g., the drain electrode pattern DEP may be between two sides of the "U" shape of the source electrode pattern SEP in the plan view). The drain electrode pattern DEP may extend in a direction perpendicular or substantially perpendicular to a scan direction of the exposure head. The channel portion pattern CHP may have or be formed as a shape corresponding to a shape of the source electrode pattern SEP. For example, the channel portion pattern CHP may have a "U" shape in a plan view.

The source electrode pattern SEP may be spaced apart from the drain electrode pattern DEP. A space between the source electrode pattern SEP and the drain electrode pattern DEP may be defined to be the channel portion pattern CHP.

The source electrode pattern SEP may be spaced apart from the drain electrode pattern DEP by a first width d1 in a direction parallel or substantially parallel with a scan direction SD of the exposure head. The source electrode pattern SEP may be spaced apart from the drain electrode pattern DEP by a second width d2 different from the first width d1, the second width d2 being in a direction perpendicular or substantially perpendicular to the scan direction SD of the exposure head. For example, the first width d1 may be greater than or more than the second width d2. In some embodiments, the first width d1 may be 2.5 μm and the second width d2 may be 2.25 μm.

In the maskless exposure device, a substrate on a stage moves at a constant speed (e.g., moves at a constant speed relative to an exposure part), and the substrate on the stage is exposed by one digital micro-mirror device (or a plurality of digital micro-mirror devices). For example, when a moving speed of the stage is constant, an interval from first exposure to second exposure may be constant. Herein, when the moving speed of the stage is constant, the interval from first exposure to second exposure may be defined as a pulse event generation (PEG).

A shape of patterns formed by the maskless exposure device may be affected by various factors, such as a size of a beam, a pulse event generation (PEG), and the like. For example, a shape of patterns formed in a direction perpendicular or substantially perpendicular to the scan direction SD of the exposure head may be affected by any of the foregoing factors. Since an embodiment of a maskless exposure device has a constant pulse event generation, the number of beams irradiated to form a pattern extended in a direction perpendicular or substantially perpendicular to the scan direction SD of the exposure head may be varied according to the pulse event generation (PEG). For example, according to an exemplary embodiment of the present inventive concept, the pulse event generation of the exposure beam may be 1.25 μm.

A shape of patterns extended in a direction parallel or substantially parallel with the scan direction SD of the exposure head may be unaffected by the pulse event generation (PEG). However, the shape of patterns extended in the direction perpendicular or substantially perpendicular to the scan direction SD of the exposure head may be affected by the pulse event generation (PEG). For example, when the pulse event generation (PEG) is 1.25 μm and a width of the pattern extended in a direction perpendicular or substantially perpendicular to the scan direction SD of the exposure head is 1.25 μm, the number of beams irradiated to form the pattern extended in the direction perpendicular or substantially perpendicular to the scan direction SD of the exposure head may be one. In addition, when the pulse event generation (PEG) is 1.25 μm and a width of the pattern extended in the direction perpendicular or substantially perpendicular to the scan direction SD of the exposure head is 2.5 μm, the number of beams irradiated to form the pattern extended in the direction perpendicular or substantially perpendicular to the scan direction SD of the exposure head may be two. However, when the pulse event generation (PEG) is 1.25 μm and a width of the pattern extended in the direction perpendicular or substantially perpendicular to the scan direction SD of the exposure head is 2.25 μm, the number of beams irradiated to form the pattern extended in the direction perpendicular or substantially perpendicular to the scan direction SD of the exposure head may be two.

Since the shape of patterns extended in the direction perpendicular or substantially perpendicular to the scan direction SD of the exposure head may be affected by the pulse event generation (PEG), when the pulse event generation (PEG) is improperly corresponded to or correlated with the width of the pattern extended in the direction perpendicular or substantially perpendicular to the scan direction SD of the exposure head, defects on the pattern extended in the direction perpendicular or substantially perpendicular to the scan direction SD of the exposure head may occur. For example, such a defect may include a space between a source electrode and a drain electrode being formed non-uniformly or irregularly such that the source electrode and the drain electrode may be shorted. When a width of the pattern extended in the direction perpendicular or substantially perpendicular to the scan direction SD of the exposure head and a width of the pattern extended in the direction parallel or substantially parallel with the scan direction SD of the exposure head is designed or formed to be 2.25 μm, the pattern extended in the direction parallel or substantially parallel with the scan direction SD of the exposure head may be formed uniformly. However, since the number of beams irradiated to form the pattern extended in the direction perpendicular or substantially perpendicular to the scan direction SD of the exposure head is two, the pattern extended in the direction perpendicular or substantially perpendicular to the scan direction SD of the exposure head may be formed non-uniformly or irregularly.

However, in the present exemplary embodiment, the source electrode pattern SEP is spaced apart from the drain electrode pattern DEP by the first width. The first width may be defined to be a multiple of the pulse event generation of the exposure beam. For example, the pulse event generation (PEG) may be 1.25 μm, and the width of the pattern extended in the direction parallel or substantially parallel with the scan direction SD of the exposure head may be 2.25 μm (e.g., the width in the direction perpendicular or substantially perpendicular to the scan direction SD of the exposure head may be 2.25 μm), and the width of the pattern extended in the direction perpendicular or substantially perpendicular to the scan direction SD of the exposure head may be 2.5 μm (e.g., two times the PEG). Thus, the pattern extended in the direction perpendicular or substantially perpendicular to the scan direction SD of the exposure head (e.g., the width in the direction parallel or substantially parallel to the scan direction SD of the exposure head) may be formed uniformly such that defects on the pattern due to a mismatch between the pulse event generation (PEG) and the designed width of the pattern may be decreased.

Figure 7:
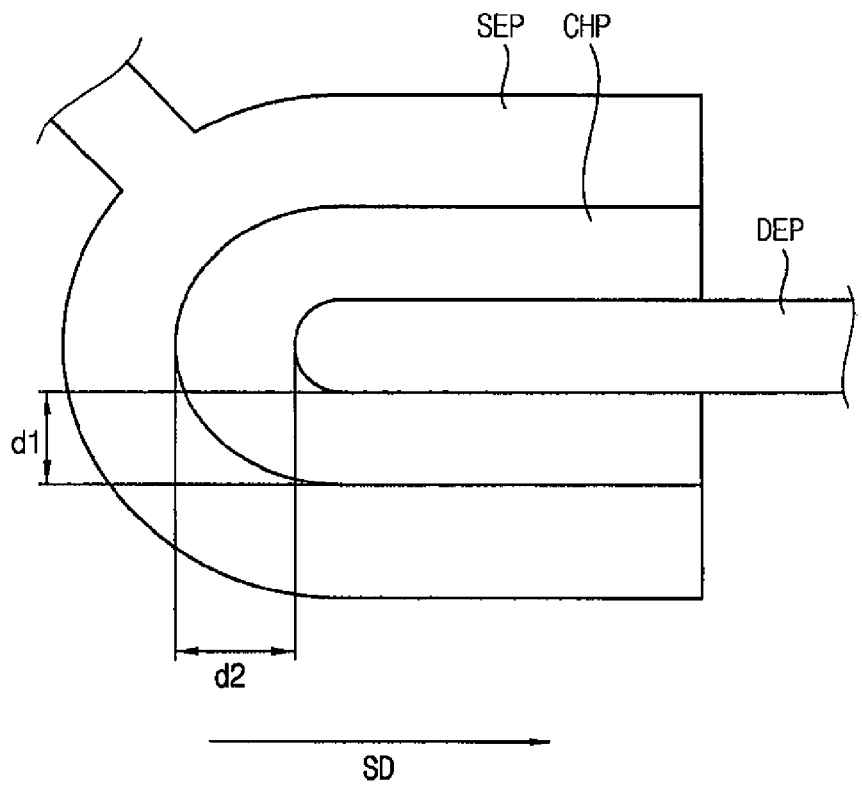
FIG. 7 is a plan view illustrating a source electrode, a drain electrode and a channel portion of a graphic data system file used for a digital micro-mirror device of an exposure head according to an exemplary embodiment of the present inventive concept.
Figure 8:
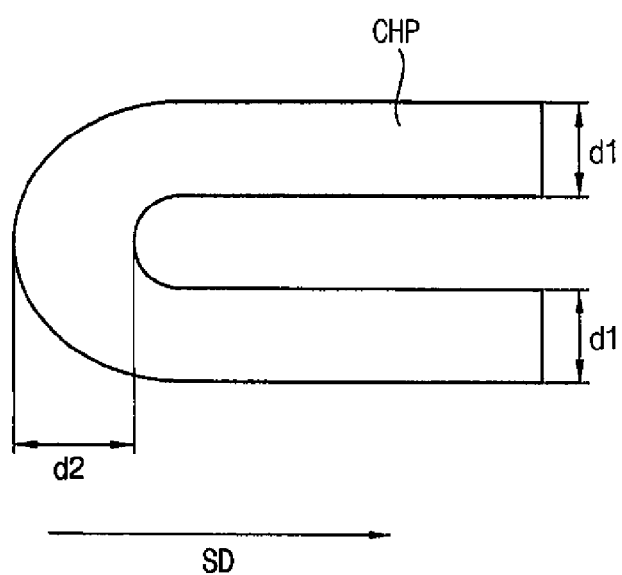
FIG. 8 is a plan view illustrating the channel portion of FIG. 7.

FIG. 7 is a plan view illustrating a source electrode, a drain electrode and a channel portion of a graphic data system file used for a digital micro-mirror device of an exposure head according to an exemplary embodiment of the present inventive concept. FIG. 8 is a plan view illustrating the channel portion of FIG. 7.

Referring to FIGS. 7 and 8, another embodiment of a source electrode pattern SEP, a drain electrode pattern DEP and a channel portion pattern CHP of a graphic data system file used for a digital micro-mirror device of an exposure head are illustrated.

The source electrode pattern SEP may have a "U" shape in a plan view. The drain electrode pattern DEP may be disposed between the electrode pattern SEP in a plan view (e.g., the drain electrode pattern DEP may be between two sides of the "U" shape of the source electrode pattern SEP in the plan view). The drain electrode pattern DEP may extend in a direction parallel or substantially parallel with a scan direction of the exposure head. The channel portion pattern CHP may have or be formed as a shape corresponding to a shape of the source electrode pattern SEP. For example, the channel portion pattern CHP may have a "U" shape in a plan view.

The source electrode pattern SEP may be spaced apart from the drain electrode pattern DEP. A space between the source electrode pattern SEP and the drain electrode pattern DEP may be defined to be the channel portion pattern CHP.

The source electrode pattern SEP may be spaced apart from the drain electrode pattern DEP by a first width d1 in a direction perpendicular or substantially perpendicular to a scan direction SD of the exposure head. The source electrode pattern SEP may be spaced apart from the drain electrode pattern DEP by a second width d2 different from the first width d1, the second width d2 being in a direction parallel or substantially parallel with the scan direction SD of the exposure head. For example, the second width d2 may be greater than or more than the first width d1. In some embodiments, the first width d1 may be 2.25 μm and the second width d2 may be 2.5 μm.

In the maskless exposure device, a substrate on a stage moves at a constant speed (e.g., moves at a constant speed relative to an exposure part), and the substrate on the stage is exposed by one digital micro-mirror device (or a plurality of digital micro-mirror devices). For example, when a moving speed of the stage is constant, an interval from first exposure to second exposure may be constant. Herein, when the moving speed of the stage is constant, the interval from first exposure to second exposure may be defined as a pulse event generation (PEG).

A shape of patterns formed by the maskless exposure device may be affected by various factors, such as a size of a beam, a pulse event generation (PEG), and the like. For example, a shape of patterns formed in a direction perpendicular or substantially perpendicular to the scan direction SD of the exposure head may be affected by any of the foregoing factors. Since an embodiment of a maskless exposure device has a constant pulse event generation, the number of beams irradiated to form a pattern extended in a direction perpendicular or substantially perpendicular to the scan direction SD of the exposure head may be varied according to the pulse event generation (PEG). For example, according to an exemplary embodiment of the present inventive concept, the pulse event generation of the exposure beam may be 1.25 μm.

A shape of patterns extended in a direction parallel or substantially parallel with the scan direction SD of the exposure head may be unaffected by the pulse event generation (PEG). However, the shape of patterns extended in the direction perpendicular or substantially perpendicular to the scan direction SD of the exposure head may be affected by the pulse event generation (PEG). For example, when the pulse event generation (PEG) is 1.25 μm and a width of the pattern extended in a direction perpendicular or substantially perpendicular to the scan direction SD of the exposure head is 1.25 μm, the number of beams irradiated to form the pattern extended in the direction perpendicular or substantially perpendicular to the scan direction SD of the exposure head may be one. In addition, when the pulse event generation (PEG) is 1.25 μm and a width of the pattern extended in the direction perpendicular or substantially perpendicular to the scan direction SD of the exposure head is 2.5 μm, the number of beams irradiated to form the pattern extended in the direction perpendicular or substantially perpendicular to the scan direction SD of the exposure head may be two. However, when the pulse event generation (PEG) is 1.25 μm and a width of the pattern extended in the direction perpendicular or substantially perpendicular to the scan direction SD of the exposure head is 2.25 μm, the number of beams irradiated to form the pattern extended in the direction perpendicular or substantially perpendicular to the scan direction SD of the exposure head may be two.

Since the shape of patterns extended in the direction perpendicular or substantially perpendicular to the scan direction SD of the exposure head may be affected by the pulse event generation (PEG), when the pulse event generation (PEG) is improperly corresponded to or correlated with the width of the pattern extended in the direction perpendicular or substantially perpendicular to the scan direction SD of the exposure head, defects on the pattern extended in the direction perpendicular or substantially perpendicular to the scan direction SD of the exposure head may occur. For example, such a defect may include a space between a source electrode and a drain electrode being formed non-uniformly or irregularly such that the source electrode and the drain electrode may be shorted. When a width of the pattern extended in the direction perpendicular or substantially perpendicular to the scan direction SD of the exposure head and a width of the pattern extended in the direction parallel or substantially parallel with the scan direction SD of the exposure head is designed or formed to be 2.25 µm, the pattern extended in the direction parallel or substantially parallel with the scan direction SD of the exposure head may be formed uniformly. However, since the number of beams irradiated to form the pattern extended in the direction perpendicular or substantially perpendicular to the scan direction SD of the exposure head is two, the pattern extended in the direction perpendicular or substantially perpendicular to the scan direction SD of the exposure head may be formed non-uniformly or irregularly.

However, in the present exemplary embodiment, the source electrode pattern SEP is spaced apart from the drain electrode pattern DEP by the first width. The first width may be defined to be a multiple of the pulse event generation of the exposure beam. For example, the pulse event generation (PEG) may be 1.25 µm, and the width of the pattern extended in the direction parallel or substantially parallel with the scan direction SD of the exposure head may be 2.25 µm (e.g., the width in the direction perpendicular or substantially perpendicular to the scan direction SD of the exposure head may be 2.25 µm), and the width of the pattern extended in the direction perpendicular or substantially perpendicular to the scan direction SD of the exposure head may be 2.5 µm (e.g., two times the PEG). Thus, the pattern extended in the direction perpendicular or substantially perpendicular to the scan direction SD of the exposure head (e.g., the width in the direction parallel or substantially parallel to the scan direction SD of the exposure head) may be formed uniformly such that defects on the pattern due to a mismatch between the pulse event generation (PEG) and the designed width of the pattern may be decreased.

Figure 9:
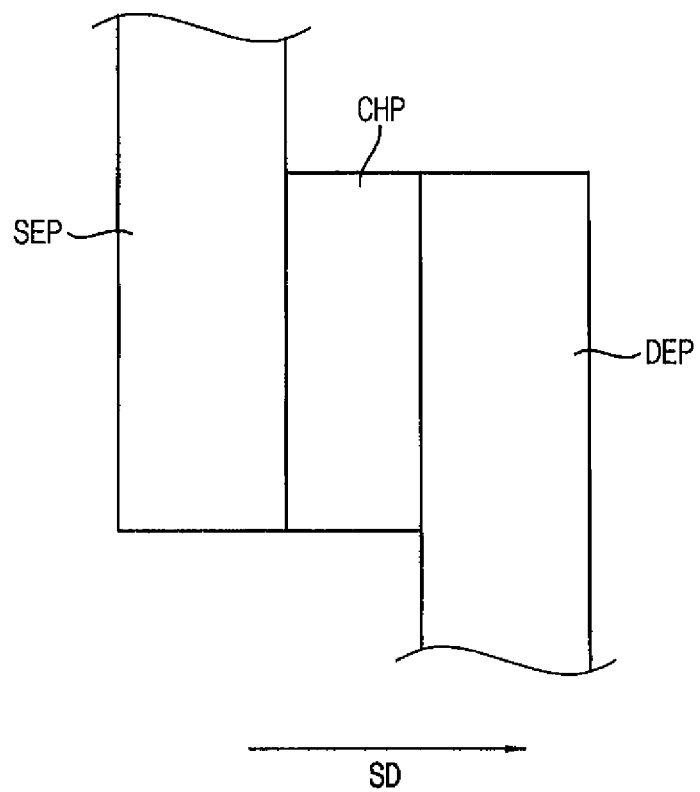
FIG. 9 is a plan view illustrating a source electrode, a drain electrode and a channel portion of a graphic data system file used for a digital micro-mirror device of an exposure head according to an exemplary embodiment of the present inventive concept.
Figure 10:
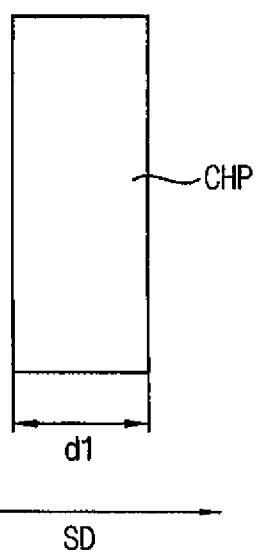
FIG. 10 is a plan view illustrating the channel portion of FIG. 9.

FIG. 9 is a plan view illustrating a source electrode, a drain electrode and a channel portion of a graphic data system file used for a digital micro-mirror device of an exposure head according to an exemplary embodiment of the present inventive concept. FIG. 10 is a plan view illustrating the channel portion of FIG. 9.

Referring to FIGS. 9 and 10, another embodiment of a source electrode pattern SEP, a drain electrode pattern DEP and a channel portion pattern CHP of a graphic data system file used for a digital micro-mirror device of an exposure head are illustrated.

The source electrode pattern SEP and the drain electrode pattern DEP may have an "I" shape in a plan view. The source electrode pattern SEP and the drain electrode pattern DEP may be disposed alternately. The source electrode pattern SEP and the drain electrode pattern DEP may have the same or substantially the same shape. The source electrode pattern SEP and the drain electrode pattern DEP may extend in a direction perpendicular or substantially perpendicular to a scan direction of the exposure head. The channel portion pattern CHP may be disposed between the source electrode pattern SEP and the drain electrode pattern DEP. For example, the channel portion pattern CHP may have an "I" shape in a plan view.

The source electrode pattern SEP may be spaced apart from the drain electrode pattern DEP. A space between the source electrode pattern SEP and the drain electrode pattern DEP may be defined to be the channel portion pattern CHP.

The source electrode pattern SEP may be spaced apart from the drain electrode pattern DEP by a first width d1 in the direction parallel or substantially parallel to the scan direction SD of the exposure head. For example, the first width d1 may be 2.5 µm.

In the maskless exposure device, a substrate on a stage moves at a constant speed (e.g., moves at a constant speed relative to an exposure part), and the substrate on the stage is exposed by one digital micro-mirror device (or a plurality of digital micro-mirror devices). For example, when a moving speed of the stage is constant, an interval from first exposure to second exposure may be constant. Herein, when the moving speed of the stage is constant, the interval from first exposure to second exposure may be defined as a pulse event generation (PEG).

A shape of patterns formed by the maskless exposure device may be affected by various factors, such as a size of a beam, a pulse event generation (PEG), and the like. For example, a shape of patterns formed in a direction perpendicular or substantially perpendicular to the scan direction SD of the exposure head may be affected by any of the foregoing factors. Since an embodiment of a maskless exposure device has a constant pulse event generation, the number of beams irradiated to form a pattern extended in a direction perpendicular or substantially perpendicular to the scan direction SD of the exposure head may be varied according to the pulse event generation (PEG). For example, according to an exemplary embodiment of the present inventive concept, the pulse event generation of the exposure beam may be 1.25 µm.

A shape of patterns extended in a direction parallel or substantially parallel with the scan direction SD of the exposure head may be unaffected by the pulse event generation (PEG). However, the shape of patterns extended in the direction perpendicular or substantially perpendicular to the scan direction SD of the exposure head may be affected by the pulse event generation (PEG). For example, when the pulse event generation (PEG) is 1.25 µm and a width of the pattern extended in a direction perpendicular or substantially perpendicular to the scan direction SD of the exposure head is 1.25 µm, the number of beams irradiated to form the pattern extended in the direction perpendicular or substantially perpendicular to the scan direction SD of the exposure head may be one. In addition, when the pulse event generation (PEG) is 1.25 µm and a width of the pattern extended in the direction perpendicular or substantially perpendicular to the scan direction SD of the exposure head is 2.5 µm, the number of beams irradiated to form the pattern extended in the direction perpendicular or substantially perpendicular to the scan direction SD of the exposure head may be two. However, when the pulse event generation (PEG) is 1.25 µm and a width of the pattern extended in a direction perpendicular or substantially perpendicular to the scan direction SD of the exposure head is 2.25 µm, the number of beams irradiated to form the pattern extended in the direction perpendicular or substantially perpendicular to the scan direction SD of the exposure head may be two.

Since the shape of patterns extended in the direction perpendicular or substantially perpendicular to the scan direction SD of the exposure head may be affected by the pulse event generation (PEG), when the pulse event generation (PEG) is improperly corresponded to or correlated with the width of the pattern extended in the direction perpendicular or substantially perpendicular to the scan direction SD of the exposure head, defects on the pattern extended in the direction perpendicular or substantially perpendicular to the scan direction SD of the exposure head may occur. For example, such a defect may include a space between a source electrode and a drain electrode being formed non-uniformly or irregularly such that the source electrode and the drain electrode may be shorted. When a width of the pattern extended in the direction perpendicular or substantially perpendicular to the scan direction SD of the exposure head and a width of the pattern extended in the direction parallel or substantially parallel with the scan direction SD of the exposure head is designed or formed to be 2.25 μm, the pattern extended in the direction parallel or substantially parallel with the scan direction SD of the exposure head may be formed uniformly. However, since the number of beams irradiated to form the pattern extended in the direction perpendicular or substantially perpendicular to the scan direction SD of the exposure head is two, the pattern extended in the direction perpendicular or substantially perpendicular to the scan direction SD of the exposure head may be formed non-uniformly or irregularly.

However, in the present exemplary embodiment, the source electrode pattern SEP is spaced apart from the drain electrode pattern DEP by the first width. The first width may be defined to be a multiple of the pulse event generation of the exposure beam. For example, the pulse event generation (PEG) may be 1.25 μm, and the width of the pattern extended in the direction perpendicular or substantially perpendicular to the scan direction SD of the exposure head may be 2.5 μm (e.g., two times the PEG). Thus, the pattern extended in the direction perpendicular or substantially perpendicular to the scan direction SD of the exposure head (e.g., the width in the direction parallel or substantially parallel to the scan direction SD of the exposure head) may be formed uniformly such that defects on the pattern due to a mismatch between the pulse event generation (PEG) and the designed width of the pattern may be decreased.

Figure 11:
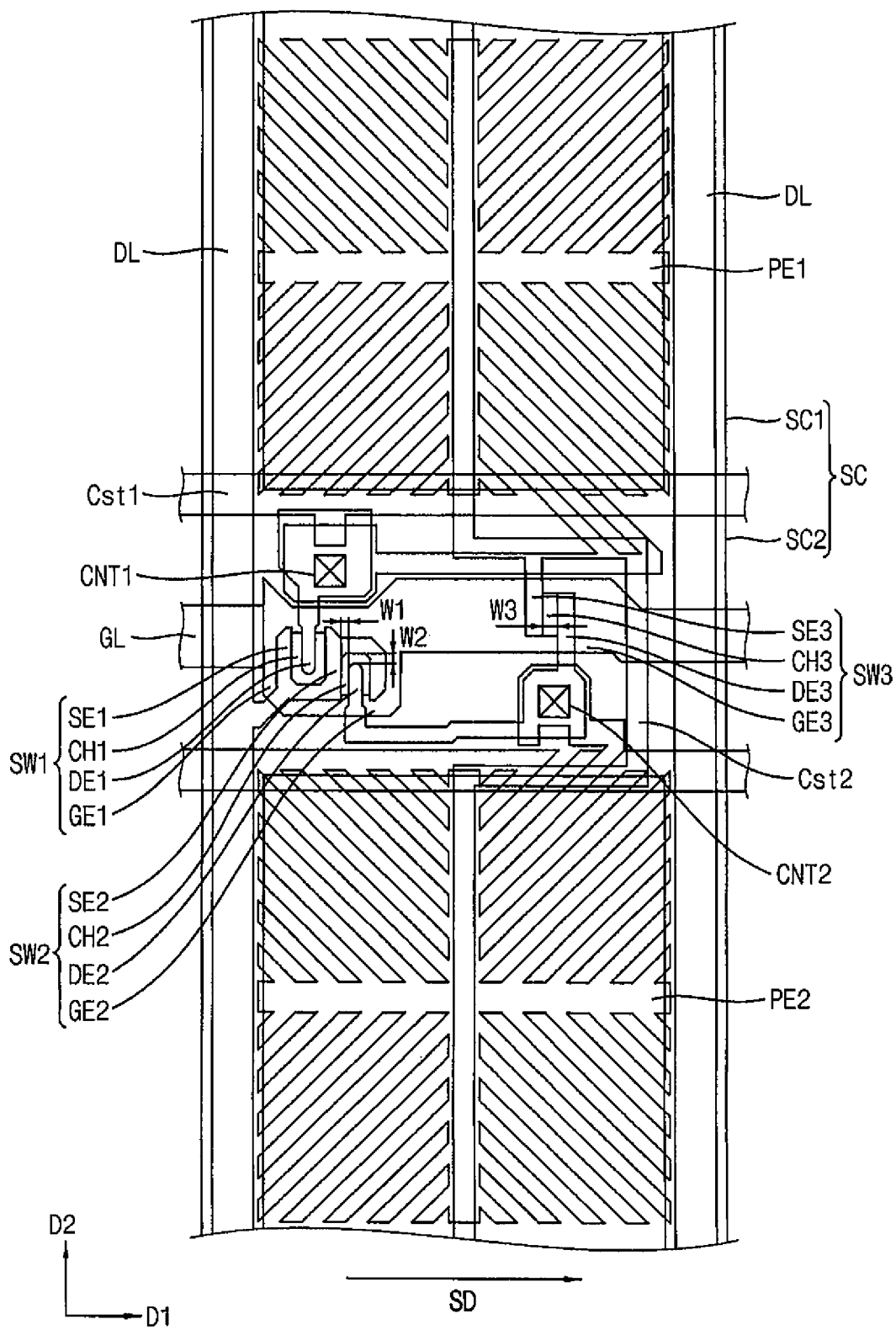
FIG. 11 is a plan view illustrating a display substrate manufactured by a maskless exposure device according to an exemplary embodiment of the present inventive concept.

FIG. 11 is a plan view illustrating a display substrate manufactured by a maskless exposure device according to an exemplary embodiment of the present inventive concept.

Referring to FIG. 11, a display substrate includes a gate line GL, a data line DL, a first storage line Cst1, a second storage line Cst2, a first switching element SW1, a second switching element SW2, a third switching element SW3, a shielding electrode SC, a high-pixel electrode PE1 and a low-pixel electrode PE2.

The gate line GL extends in a first direction D1. The gate line GL may have a single layer structure including copper (Cu), silver (Ag), chrome (Cr), molybdenum (Mo), aluminum (Al), titanium (Ti), manganese (Mn) or a mixture thereof. In addition, the gate line GL may have a multi layer structure having a plurality of layers including materials different from each other. For example, the gate line GL may include a copper layer and a titanium layer disposed on and/or under the copper layer. The gate line GL is electrically coupled or connected to a first gate electrode GE1 of the first switching element SW1, a second gate electrode GE2 of the second switching element SW2, and a third gate electrode GE3 of the third switching element SW3. Portions of the gate line GL may form the first gate electrode GE1, the second gate electrode GE2, and the third gate electrode GE3.

The data line DL extends in a second direction D2 perpendicular or substantially perpendicular to the first direction D1. The data line DL may have a single layer structure including copper (Cu), silver (Ag), chrome (Cr), molybdenum (Mo), aluminum (Al), titanium (Ti), manganese (Mn) or a mixture thereof. In addition, the data line DL may have a multi layer structure having a plurality of layers including materials different from each other. For example, the data line DL may include a copper layer and a titanium layer disposed on and/or under the copper layer. The data line DL is electrically coupled or connected to a first source electrode SE1 of the first switching element SW1, and a second source electrode SE2 of the second switching element SW2.

The high-pixel electrode PE1 is disposed adjacent to the gate line GL in the second direction D2, and between the first data line DL1 and the second data line DL2. The high-pixel electrode PE1 is electrically coupled or connected to a first drain electrode DE1 of the first switching element SW1 through a first contact hole CNT1.

The low-pixel electrode PE2 is disposed opposite to the high-pixel electrode PE1 with reference to the gate line GL, and between the first data line DL1 and the second data line DL2. The low-pixel electrode PE2 is electrically coupled or connected to the second drain electrode DE2 of the second switching element SW2 and the third drain electrode DE3 of the third switching element SW3 through a second contact hole CNT2.

A first voltage may be applied to the high-pixel electrode PE1. A second voltage different from the first voltage may be applied to the low-pixel electrode PE2. For example, the first voltage may be higher than the second voltage. A portion of the pixel corresponding to the high-pixel electrode PE1 may be driven as a high pixel, and another portion of the pixel corresponding to the low-pixel electrode PE2 may be driven as a low pixel.

The first storage line Cst1 extends in the first direction D1. The first storage line Cst1 overlaps with the high-pixel electrode PE1. The first storage line Cst1 may be formed from a same layer as the gate line GL. Thus, the first storage line Cst1 may be disposed on the same layer as the gate line GL. The first storage line Cst1 may have a single layer structure including copper (Cu), silver (Ag), chrome (Cr), molybdenum (Mo), aluminum (Al), titanium (Ti), manganese (Mn) or a mixture thereof. In addition, the first storage line Cst1 may have a multi layer structure having a plurality of layers including materials different from each other. For example, the first storage line Cst1 may include a copper layer and a titanium layer disposed on and/or under the copper layer.

The second storage line Cst2 may be formed from a same layer as the data line DL. Thus, the second storage line Cst2 may be disposed on the same layer as the data line DL. The second storage line Cst2 may have a single layer structure including copper (Cu), silver (Ag), chrome (Cr), molybdenum (Mo), aluminum (Al), titanium (Ti), manganese (Mn) or a mixture thereof. In addition, the second storage line Cst2 may have a multi layer structure having a plurality of layers including materials different from each other. For example, the second storage line Cst2 may include a copper layer and a titanium layer disposed on and/or under the copper layer. The second storage line Cst2 is electrically coupled or connected to a third source electrode SE3 of the third switching element SW3.

An insulation layer is on or formed on the data line and the second storage line Cst2. The insulation layer may include an inorganic material such as silicon oxide (SiOx, where 0<x<2) and/or silicon nitride (SiNx, where 0<x<4/3). For example, the insulation layer may include silicon oxide (SiOx), and may have thickness of about 500 Å. The insulation layer may include a plurality of layers including materials different from each other.

An organic layer is on or formed on the insulation layer. The organic insulating layer may planarize an upper surface of the display substrate 100, so that problems due to a step (or a defect) such as disconnection of a signal line may be prevented or reduced. The organic layer may be an insulation layer including an organic material. For example, the organic layer may be a color filter layer.

The shielding electrode SC is on or formed on the organic layer. The shielding electrode SC may include a first portion SC1 overlapping with the data line DL and a second portion SC2 overlapping with the gate line GL.

The shielding electrode SC may include a transparent conductive material, such as indium tin oxide (ITO), indium zinc oxide (IZO), and/or the like. In addition, the shielding electrode SC may include titanium (Ti) and/or molybdenum titanium (MoTi).

The first portion SC1 of the shielding electrode SC may overlap with the data line DL. The first portion SC1 may extend in the second direction D2. A width of the first portion SC1 may be wider than a width of the second portion SC2. In addition, the first portion SC1 of the shielding electrode SC may overlap with an edge of the pixel electrode PE.

The second portion SC2 of the shielding electrode SC may overlap with the gate line GL. In addition, the second portion SC2 may entirely overlap with a region between pixel electrodes adjacent to each other in the second direction D2. The second direction D2 may overlap with an edge of the pixel electrode PE.

A passivation layer is on or formed on the shielding electrode SC. The passivation layer may include an inorganic material such as silicon oxide (SiOx, where 0<x<2) and/or silicon nitride (SiNx, where 0<x<4/3). For example, the passivation layer may include silicon oxide (SiOx), and may have thickness of about 500 Å. The passivation layer may include a plurality of layers including materials different from each other.

A pixel electrode is on or formed on the passivation layer. The pixel electrode may include the high-pixel electrode PE1 and the low-pixel electrode PE2.

The first switching element SW1 includes the first gate electrode GE1, the first source electrode SE1, the first drain electrode DE1 and a first channel portion CH1 coupling or connecting the first source electrode SE1 to the first drain electrode DE1.

The first channel portion CH1 may include a semiconductor layer including or consisting of amorphous silicon (a–Si:H) and an ohmic contact layer including or consisting of n+ amorphous silicon (n+a–Si:H). In addition, the first channel portion CH1 may include an oxide semiconductor. The oxide semiconductor may include an amorphous oxide including at least one selected from the group consisting of indium (In), zinc (Zn), gallium (Ga), tin (Sn) and hafnium (Hf).

The second switching element SW2 includes the second gate electrode GE2, the second source electrode SE2, the second drain electrode DE2 and a second channel portion CH2 coupling or connecting the second source electrode SE2 to the second drain electrode DE2.

The second channel portion CH2 may include a semiconductor layer including or consisting of amorphous silicon (a–Si:H) and an ohmic contact layer including or consisting of n+ amorphous silicon (n+a–Si:H). In addition, the second channel portion CH2 may include an oxide semiconductor. The oxide semiconductor may include an amorphous oxide including at least one selected from the group consisting of indium (In), zinc (Zn), gallium (Ga), tin (Sn) and hafnium (Hf).

The third switching element SW3 includes the third gate electrode GE3, the third source electrode SE3, the third drain electrode DE3 and a third channel portion CH3 coupling or connecting the third source electrode SE3 to the third drain electrode DE3.

The third channel portion CH3 may include a semiconductor layer including or consisting of amorphous silicon (a–Si:H) and an ohmic contact layer including or consisting of n+ amorphous silicon (n+a–Si:H). In addition, the third channel portion CH3 may include an oxide semiconductor. The oxide semiconductor may include an amorphous oxide including at least one selected from the group consisting of indium (In), zinc (Zn), gallium (Ga), tin (Sn) and hafnium (Hf).

In the present exemplary embodiment, the gate line GL extends in a direction parallel or substantially parallel with the scan direction of the exposure head. Thus, the first drain electrode DE1, the second drain electrode DE2 and the third drain electrode DE3 extend in a direction perpendicular or substantially perpendicular to the scan direction SD of the exposure head.

A switching element according to the present exemplary embodiment may be formed as a shape corresponding to that of a graphic data system file. For example, in FIG. 11, the second source electrode SE2 is spaced apart from the second drain electrode DE2 by a first distance W1 in a direction parallel or substantially parallel with the scan direction of the exposure head. In addition, the second source electrode SE2 is spaced apart from the second drain electrode DE2 by a second distance W2 different from the first distance W1, the second distance W2 being in a direction perpendicular or substantially perpendicular to the scan direction of the exposure head. The first distance W1 may be greater than or more than the second distance W2.

In addition, in FIG. 11, the third source electrode SE3 is spaced apart from the third drain electrode DE3 by a third distance W3 in a direction parallel or substantially parallel with the scan direction of the exposure head. The third distance W3 may be greater than or more than the second distance W2. The first distance W1 and the third distance W3 may be substantially the same.

Figure 12:
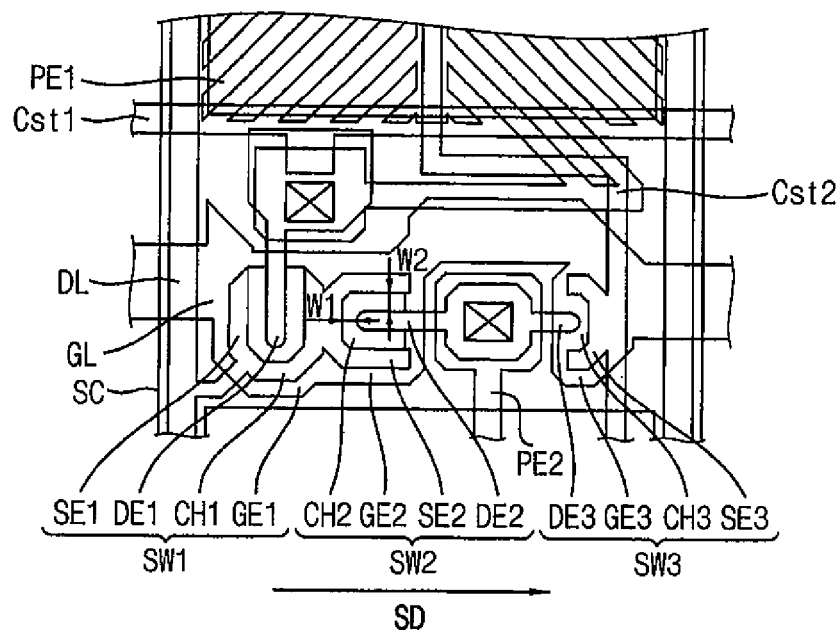
FIG. 12 is a plan view illustrating a switching element of a display substrate manufactured by a maskless exposure device according to an exemplary embodiment of the present inventive concept.

FIG. 12 is a plan view illustrating a switching element of a display substrate manufactured by a maskless exposure device according to an exemplary embodiment of the present inventive concept.

Referring to FIG. 12, a display substrate includes a gate line GL, a data line DL, a first storage line Cst1, a second storage line Cst2, a first switching element SW1, a second switching element SW2, a third switching element SW3 and a shielding electrode SC.

The first switching element SW1 includes a first gate electrode GE1, a first source electrode SE1, a first drain electrode DE1 and a first channel portion CH1 coupling or connecting the first source electrode SE1 to the first drain electrode DE1.

The first source electrode SE1 of the first switching element SW1 is electrically coupled or connected to the data line DL. The first gate electrode GE1 of the first switching element SW1 electrically coupled or connected to the gate line GL. The first drain electrode DE1 of the first switching element SW1 is electrically coupled or connected to a high-pixel electrode PE1.

The first channel portion CH1 may include a semiconductor layer including or consisting of amorphous silicon (a–Si:H) and an ohmic contact layer including or consisting of n+ amorphous silicon (n+a–Si:H). In addition, the first channel portion CH1 may include an oxide semiconductor. The oxide semiconductor may include an amorphous oxide including at least one selected from the group consisting of indium (In), zinc (Zn), gallium (Ga), tin (Sn) and hafnium (Hf).

The second switching element SW2 includes a second gate electrode GE2, a second source electrode SE2, a second drain electrode DE2 and a second channel portion CH2 coupling or connecting the second source electrode SE2 to the second drain electrode DE2.

The second source electrode SE2 of the second switching element SW2 is electrically coupled or connected to the data line DL. The second gate electrode GE2 of the second switching element SW2 is electrically coupled or connected to the gate line GL. The second drain electrode DE2 of the second switching element SW2 is electrically coupled or connected to a low-pixel electrode PE2.

The second channel portion CH2 may include a semiconductor layer including or consisting of amorphous silicon (a–Si:H) and an ohmic contact layer including or consisting of n+ amorphous silicon (n+a–Si:H). In addition, the second channel portion CH2 may include an oxide semiconductor. The oxide semiconductor may include an amorphous oxide including at least one selected from the group consisting of indium (In), zinc (Zn), gallium (Ga), tin (Sn) and hafnium (Hf).

The third switching element SW3 includes a third gate electrode GE3, a third source electrode SE3, a third drain electrode DE3 and a third channel portion CH3 coupling or connecting the third source electrode SE3 to the third drain electrode DE3.

The third source electrode SE3 of the third switching element SW3 is electrically coupled or connected to the second storage line Cst2. A storage voltage may be applied to the third source electrode SE3 of the third switching element SW3. The third gate electrode GE3 of the third switching element SW3 is electrically coupled or connected to the gate line GL. The third drain electrode DE3 of the third switching element SW3 is electrically coupled or connected to the low-pixel electrode PE2.

The third channel portion CH3 may include a semiconductor layer including or consisting of amorphous silicon (a–Si:H) and an ohmic contact layer including or consisting of n+ amorphous silicon (n+a–Si:H). In addition, the third channel portion CH3 may include an oxide semiconductor. The oxide semiconductor may include an amorphous oxide including at least one selected from the group consisting of indium (In), zinc (Zn), gallium (Ga), tin (Sn) and hafnium (Hf).

In the present exemplary embodiment, the gate line DL extends in a direction parallel or substantially parallel with the scan direction of the exposure head. Thus, the first drain electrode DE1 extends in a direction perpendicular or substantially perpendicular to the scan direction SD of the exposure head. The second drain electrode DE2 and the third drain electrode DE3 each extend in a direction parallel or substantially parallel with the scan direction SD of the exposure head.

A switching element according to the present exemplary embodiment may be formed as a shape corresponding to that of a graphic data system file. For example, in FIG. 12, the second source electrode SE2 is spaced apart from the second drain electrode DE2 by a first distance W1 in a direction parallel or substantially parallel with the scan direction of the exposure head. In addition, the second source electrode SE2 is spaced apart from the second drain electrode DE2 by a second distance W2 different from the first distance W1, the second distance W2 being in a direction perpendicular or substantially perpendicular to the scan direction of the exposure head. The first distance W1 may be greater than or more than the second distance W2.

Figure 13:
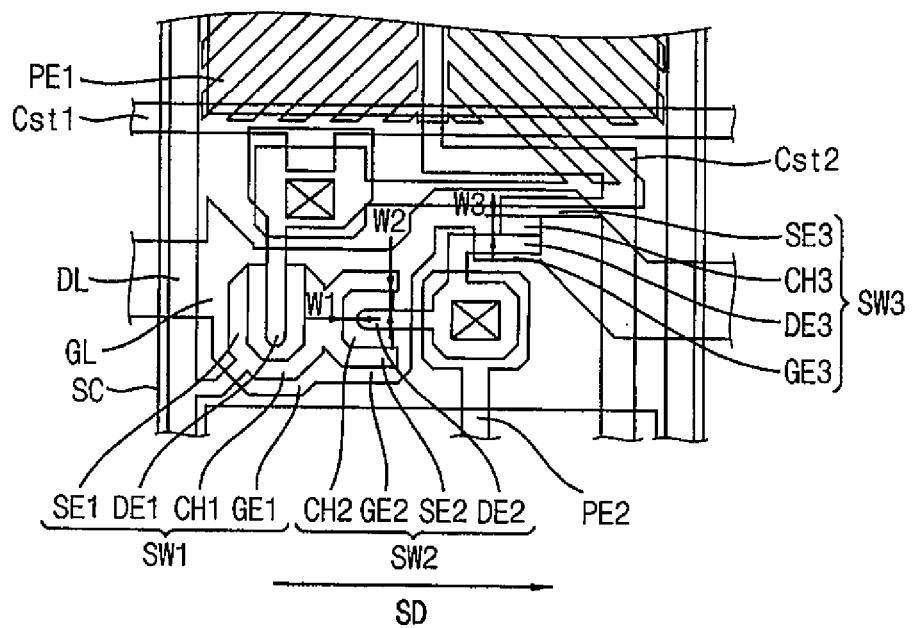
FIG. 13 is a plan view illustrating a switching element of a display substrate manufactured by a maskless exposure device according to an exemplary embodiment of the present inventive concept.

FIG. 13 is a plan view illustrating a switching element of a display substrate manufactured by a maskless exposure device according to an exemplary embodiment of the present inventive concept.

Referring to FIG. 13, a display substrate includes a gate line GL, a data line DL, a first storage line Cst1, a second storage line Cst2, a first switching element SW1, a second switching element SW2, a third switching element SW3 and a shielding electrode SC.

The first switching element SW1 includes a first gate electrode GE1, a first source electrode SE1, a first drain electrode DE1 and a first channel portion CH1 coupling or connecting first source electrode SE1 to the first drain electrode DE1.

The first source electrode SE1 of the first switching element SW1 is electrically coupled or connected to the data line DL. The first gate electrode GE1 of the first switching element SW1 is electrically coupled or connected to the gate line GL. The first drain electrode DE1 of the first switching element SW1 is electrically coupled or connected to a high-pixel electrode PE1.

The first channel portion CH1 may include a semiconductor layer including or consisting of amorphous silicon (a–Si:H) and an ohmic contact layer including or consisting of n+ amorphous silicon (n+a–Si:H). In addition, the first channel portion CH1 may include an oxide semiconductor. The oxide semiconductor may include an amorphous oxide including at least one selected from the group consisting of indium (In), zinc (Zn), gallium (Ga), tin (Sn) and hafnium (Hf).

The second switching element SW2 includes a second gate electrode GE2, a second source electrode SE2, a second drain electrode DE2 and a second channel portion CH2 coupling or connecting the second source electrode SE2 to the second drain electrode DE2.

The second source electrode SE2 of the second switching element SW2 is electrically coupled or connected to the data line DL. The second gate electrode GE2 of the second switching element SW2 is electrically coupled or connected to the gate line GL. The second drain electrode DE2 of the second switching element SW2 is electrically coupled or connected to a low-pixel electrode PE2.

The second channel portion CH2 may include a semiconductor layer including or consisting of amorphous silicon (a–Si:H) and an ohmic contact layer including or consisting of n+ amorphous silicon (n+a–Si:H). In addition, the second channel portion CH2 may include an oxide semiconductor. The oxide semiconductor may include an amorphous oxide including at least one selected from the group consisting of indium (In), zinc (Zn), gallium (Ga), tin (Sn) and hafnium (Hf).

The third switching element SW3 includes a third gate electrode GE3, a third source electrode SE3, a third drain electrode DE3 and a third channel portion CH3 coupling or connecting the third source electrode SE3 to the third drain electrode DE3.

The third source electrode SE3 of the third switching element SW3 is electrically coupled or connected to the second storage line Cst2. A storage voltage may be applied to the third source electrode SE3 of the third switching element SW3. The third gate electrode GE3 of the third switching element SW3 is electrically coupled or connected to the gate line GL. The third drain electrode DE3 of the third switching element SW3 is electrically coupled or connected to the low-pixel electrode PE2.

The third channel portion CH3 may include a semiconductor layer including or consisting of amorphous silicon (a–Si:H) and an ohmic contact layer including or consisting of n+ amorphous silicon (n+a–Si:H). In addition, the third channel portion CH3 may include an oxide semiconductor. The oxide semiconductor may include an amorphous oxide including at least one selected from the group consisting of indium (In), zinc (Zn), gallium (Ga), tin (Sn) and hafnium (Hf).

In the present exemplary embodiment, the gate line DL extends in a direction parallel or substantially parallel with the scan direction of the exposure head. Thus, the first drain electrode DE1 extends in a direction perpendicular or substantially perpendicular to the scan direction SD of the exposure head. The second drain electrode DE2 and the third drain electrode DE3 each extend in a direction parallel or substantially parallel with the scan direction SD of the exposure head.

A switching element according to the present exemplary embodiment may be formed as a shape corresponding to that of a graphic data system file. For example, in FIG. 13, the second source electrode SE2 is spaced apart from the second drain electrode DE2 by a first distance W1 in a direction parallel or substantially parallel with the scan direction of the exposure head. In addition, the second source electrode SE2 is spaced apart from the second drain electrode DE2 by a second distance W2 different from the first distance W1, the second distance W2 being in a direction perpendicular or substantially perpendicular to the scan direction of the exposure head. The first distance W1 may be greater than or more than the second distance W2.

In addition, in FIG. 13, the third source electrode SE3 is spaced apart from the third drain electrode DE3 by a third distance W3 in a direction perpendicular or substantially perpendicular to the scan direction of the exposure head. The second distance W2 and the third distance W3 may be substantially the same.

According to the present exemplary embodiment, a source electrode pattern is spaced apart from a drain electrode pattern by a first width in a direction parallel or substantially parallel with the scan direction of the exposure head. The first width may be defined as a multiple of a pulse event generation of the exposure beam. Thus, the pattern extended in a direction perpendicular or substantially perpendicular to the scan direction SD of the exposure head (e.g., a pattern having a first width in a direction parallel or substantially parallel with the scan direction of the exposure head) may be formed uniformly such that defects on the pattern due to a mismatch between the pulse event generation (PEG) and the designed width of the pattern may be decreased.

The foregoing is illustrative of the present invention and is not to be construed as limiting thereof. Although certain exemplary embodiments of the present invention have been described, those skilled in the art will readily appreciate that many modifications are possible in the exemplary embodiments without materially departing from the spirit and scope of the present invention. Accordingly, all such modifications are intended to be included within the scope of the present invention as defined in the claims, and equivalents thereof. In the claims, means-plus-function clauses are intended to cover the structures described herein as performing the recited function and not only structural equivalents but also equivalent structures. Therefore, it is to be understood that the foregoing is illustrative of the present invention and the present disclosure is not to be construed as limited to the specific exemplary embodiments disclosed herein, and that modifications to the disclosed exemplary embodiments, as well as other exemplary embodiments, are intended to be included within the scope of the appended claims, and equivalents thereof. The present inventive concept is defined by the following claims, with equivalents of the claims to be included therein.

What is claimed is:

1. A maskless exposure device comprising:
   an exposure head comprising a digital micro-mirror device, the digital micro-mirror device being configured to scan an exposure beam to a substrate by reflecting a source beam from an exposure source; and
   a system control-part configured to control the digital micro-mirror device by utilizing a graphic data system file,
   wherein the graphic data system file comprises data for a source electrode, a drain electrode, and a channel portion between the source electrode and the drain electrode in a plan view, and
   the channel portion comprises a first portion extending in a direction crossing a scan direction of the exposure head, and a first width of the first portion of the channel portion is defined to be a multiple of a pulse event generation of the exposure beam.

2. The maskless exposure device of claim 1, wherein the channel portion has a U shape in a plan view.

3. The maskless exposure device of claim 2, wherein the channel portion further comprises:
   a second portion extending in a direction parallel with the scan direction of the exposure head, and
   the second portion has a second width different from the first width.

4. The maskless exposure device of claim 3, wherein the first width is greater than the second width.

5. The maskless exposure device of claim 4, wherein the pulse event generation of the exposure beam is about 1.25 μm.

6. The maskless exposure device of claim 1, wherein the channel portion has an I shape in a plan view.

7. The maskless exposure device of claim 6, wherein the pulse event generation of the exposure beam is about 1.25 μm.

8. The maskless exposure device of claim 1, wherein the system control part comprises:
   a file producing part configured to produce the graphic data system file respectively corresponding to each of a plurality of patterns to be formed on the substrate;
   a data outputting part configured to generate digital micro-mirror device on/off data from the graphic data system file to control on/off timing of the digital micro-mirror device; and
   a transfer control part configured to output a transfer signal to move a stage relative to the digital micro-mirror device, the substrate being on the stage.

9. The maskless exposure device of claim 8, wherein the transfer control part is configured to control on/off timing of the exposure beam according to the digital micro-mirror device on/off data supplied from the data outputting part, and to transfer the stage.

10. A method of maskless exposure, the method comprising:
producing a graphic data system file corresponding to a pattern to be formed on a substrate;
generating digital micro-mirror device on/off data from the graphic data system file; and
exposing the substrate according to the digital micro-mirror device on/off data,
wherein the graphic data system file comprises data for a source electrode, a drain electrode and a channel portion between the source electrode and the drain electrode in a plan view, and
the channel portion comprises a first portion extending in a direction crossing a scan direction of an exposure head, and a first width of the first portion of the channel portion is defined to be a multiple of a pulse event generation of an exposure beam.

11. The method of claim 10, wherein the channel portion has a U shape in a plan view.

12. The method of claim 11, wherein the channel portion further comprises:
a second portion extending in a direction parallel with a scan direction of the exposure head, and
the second portion has a second width different from the first width.

13. The method of claim 12, wherein the first width is greater than the second width.

14. The method of claim 13, wherein the pulse event generation of the exposure beam is about 1.25 μm.

15. The method of claim 10, wherein the channel portion has an I shape in a plan view.

16. The method of claim 15, wherein the pulse event generation of the exposure beam is about 1.25 μm.

17. The method of claim 10, wherein the first width is defined to be a natural number multiple of the pulse event generation of the exposure beam.

18. The method of claim 17, wherein the first width is defined to be two times the pulse event generation of the exposure beam.

19. A maskless exposure device comprising:
an exposure head comprising a digital micro-mirror device, the digital micro-mirror device being configured to scan an exposure beam to a substrate by reflecting a source beam from an exposure source; and
a system control part configured to control the digital micro-mirror device by utilizing a graphic data system file,
wherein the graphic data system file comprises data for a source electrode, a drain electrode, and a channel portion between the source electrode and the drain electrode in a plan view, and
the channel portion comprises a first portion extending in a direction crossing a scan direction of the exposure head, and a first width of the first portion of the channel portion is defined to be a natural number multiple of a pulse event generation of the exposure beam.

20. The maskless exposure device of claim 19, wherein the first width is defined to be two times the pulse event generation of the exposure beam.

* * * * *